(12) United States Patent
Fratin et al.

(10) Patent No.: US 12,150,317 B2
(45) Date of Patent: Nov. 19, 2024

(54) MEMORY DEVICE AND METHOD FOR MANUFACTURING THE SAME

(71) Applicant: Micron Technology, Inc., Boise, ID (US)

(72) Inventors: Lorenzo Fratin, Buccinasco (IT); Paolo Fantini, Vimercate (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 490 days.

(21) Appl. No.: 17/431,661

(22) PCT Filed: Jul. 22, 2020

(86) PCT No.: PCT/IB2020/020042
§ 371 (c)(1),
(2) Date: Aug. 17, 2021

(87) PCT Pub. No.: WO2022/018477
PCT Pub. Date: Jan. 27, 2022

(65) Prior Publication Data
US 2022/0302211 A1    Sep. 22, 2022

(51) Int. Cl.
*H01L 27/24* (2006.01)
*H10B 63/00* (2023.01)
(Continued)

(52) U.S. Cl.
CPC ......... *H10B 63/845* (2023.02); *H10N 70/066* (2023.02); *H10N 70/231* (2023.02)

(58) Field of Classification Search
CPC ... H10B 63/845; H10N 70/066; H10N 70/231
(Continued)

(56) References Cited

U.S. PATENT DOCUMENTS 9,450,023 B1 * 9/2016 Konevecki ......... H10N 70/8265
2011/0261607 A1 10/2011 Tang et al.
(Continued)

FOREIGN PATENT DOCUMENTS

CN       111354738 A     6/2020
KR    20100095263 A     8/2010

OTHER PUBLICATIONS

ISA/KR, International Search Report and Written Opinion of the International Searching Authority, Int'l Appl. No. PCT/IB2020/020042, Apr. 21, 2021, Korean Intellectual Property Office, Seo-gu, Daejeon, Republic of Korea, 13pgs.

(Continued)

*Primary Examiner* — Dzung Tran
(74) *Attorney, Agent, or Firm* — Holland & Hart LLP

(57) ABSTRACT

Methods for, apparatuses with, and vertical 3D memory devices are described. A vertical 3D memory device may comprise: a plurality of contacts associated with a plurality of digit lines and extending through a substrate; a plurality of word line plates separated from one another by respective dielectric layers and including a first plurality of word line plates and a second plurality of word line plates; a dielectric material positioned between the first plurality and the second plurality of word line plates, the dielectric material extending in a serpentine shape over the substrate; a plurality of pillars formed over and coupled with the plurality of contacts; and a plurality of storage elements each comprising chalcogenide material positioned in a recess between a respective word line plate and a respective pillar, wherein the recess is of an arch-shape, and the chalcogenide material in the recess contacts the respective word line plate.

10 Claims, 18 Drawing Sheets

(51) Int. Cl.
  *H10N 70/00* (2023.01)
  *H10N 70/20* (2023.01)
(58) Field of Classification Search
  USPC .............................................................. 257/5
  See application file for complete search history.

(56) References Cited

U.S. PATENT DOCUMENTS

| | | | |
|---|---|---|---|
| 2011/0316063 A1* | 12/2011 | Tang | G11C 13/0069 |
| | | | 257/314 |
| 2013/0229846 A1 | 9/2013 | Chien et al. | |
| 2015/0340406 A1 | 11/2015 | Jo | |
| 2016/0126292 A1 | 5/2016 | Yanagida et al. | |
| 2016/0300885 A1 | 10/2016 | Konevecki et al. | |
| 2018/0211970 A1 | 7/2018 | Kai et al. | |
| 2019/0259946 A1* | 8/2019 | Makala | H10N 70/826 |
| 2020/0258895 A1* | 8/2020 | Xiao | H10B 43/27 |

OTHER PUBLICATIONS

Taiwan Patent Office, "Office Action", issued in connection with Taiwan Patent Application No. 110126525 dated Jul. 4, 2022 (10 pages).

\* cited by examiner

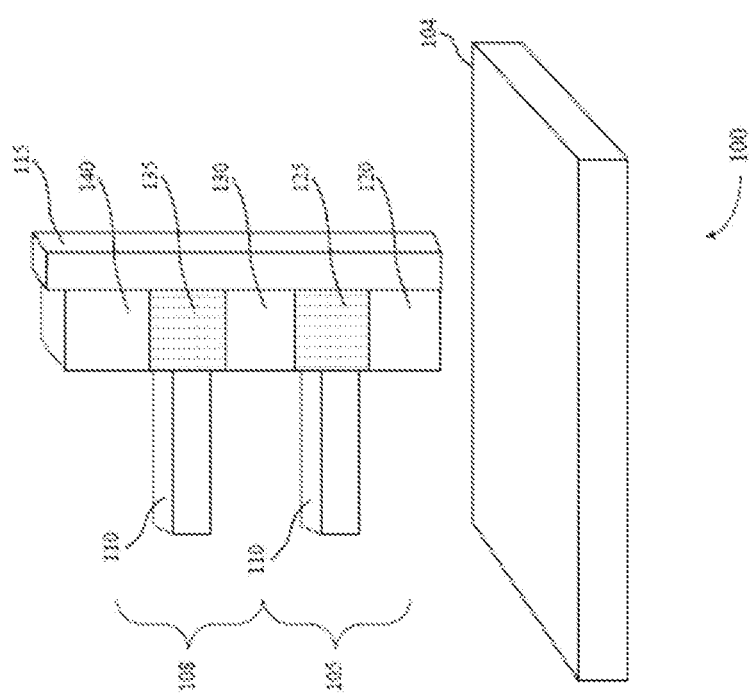

MEMORY DEVICE AND METHOD FOR MANUFACTURING THE SAME

CROSS REFERENCE

The present Application for Patent is 371 national phase filing of International Patent Application No. PCT/IB2020/020042 by Fratin et al., entitled "MEMORY DEVICE AND METHOD FOR MANUFACTURING THE SAME," filed Jul. 22, 2020, which is assigned to the assignee hereof, and which is expressly incorporated by reference in its entirety herein.

DESCRIPTION

Technical Field

The following disclosure relates generally to a memory array that includes at least one memory cell and more specifically to a vertical 3D (three dimensional) memory device and method for manufacturing the same.

Background Art

Memory devices are widely used to store information in various electronic devices such as computers, wireless communication devices, cameras, digital displays, and the like.

Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speed, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

BRIEF DESCRIPTION OF THE DRAWINGS

FIG. 1 illustrates an example of a vertical 3D memory array in accordance with examples as disclosed herein.

DETAILED DESCRIPTION

Figure 2A:
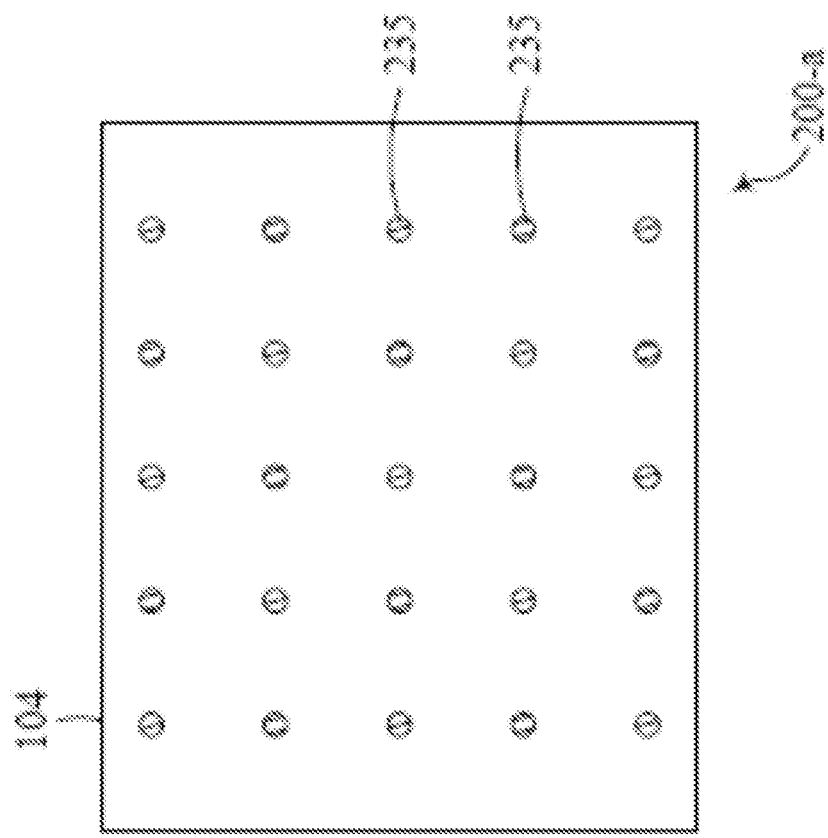
FIG. 2A illustrates a bottom view of an example 3D memory array in accordance with examples as disclosed herein.

The present disclosure relates to three-dimensional (3D) vertical self-selecting memory arrays with an increased density of memory cells and compacted memory cells, and methods of manufacturing the same. The memory arrays may include an arrangement of conductive contacts and openings through alternative layers of conductive materials and insulative material that may decrease the spacing between the memory cells while maintaining a dielectric thickness to sustain the voltage to be applied to the memory array. A contact area between a storage element material of the memory cell and the conductive material may be reduced because the storage element is formed in a recess of an arch-shape with a middle part (for example, an arch crown) contacting the conductive material.

In some examples, a 3D memory array may include a substrate with a plurality of contacts arranged in a pattern (e.g., a geometric pattern) and a first insulative material formed on the substrate. A plurality of planes of a conductive material may be separated from one another by a second insulative material and formed on the substrate material. The planes of conductive material may be examples of word lines.

During manufacturing of such a memory array, a trench may be formed in a shape that separates odd and even WL line planes to create "comb" structures (e.g., structures that look like a tool with fingers and space between the fingers). The trench may have any geometric configuration and include odd and even groups of fingers of the comb facing one another at a fixed distance. In some examples, the trench may be formed in a serpentine shape. The trench may divide each plane of conductive material into two sections or two plates. Each place of conductive material may be an example of a word line plate. In some examples, inside the trench, the planes of the conductive material may be etched in such a way that the insulative materials and the conductive materials form a plurality of grooves, where each groove may be configured to receive a storage element material (e.g., a chalcogenide material). A dielectric material may be deposited in the trench, and in some cases, the dielectric material may fill the grooves. The dielectric material may form a serpentine shape. In some examples, other geometric configurations of the trench are contemplated.

Portions of the dielectric material may be removed through an etching process (for example, a dry etching process) to form openings. The openings may expose portions of the substrate, the plurality of conductive contacts, and portions of the conductive materials and insulative materials. In some examples, the opening may be formed in an oval shape. In some examples, other geometric configurations of the opening are contemplated. For instance, rectangle openings may be formed. In some examples, walls of the dielectric material may be exposed in the openings. Another etching process (for example, an isotropic wet etching process) may be performed to enlarge the openings in each plane of the conductive material so that the enlarged openings are tangent (with a certain excess tolerance) to the conductive material. A storage element material (e.g., the chalcogenide material) may be deposited in the enlarged openings. The storage element material may be partially removed from the openings such that only the storage element materials in recesses of an arch-shape remain. In some examples, each of the recesses in an arch-shape may be formed by the conductive material, the dielectric material, and the insulative material.

Conductive pillars may be formed in the openings that include the storage element materials in the arched recesses. In some examples, the storage element material may contact the conductive material at middle (for example, the arch crown) of the arched recess, while contacting the conductive pillar at the base (for example, a wider bottom part) of the arched recess. In some examples, the storage element material may contact the dielectric material at opposite sides of the arched recess between the middle and the base. The conductive pillars may be examples of digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material.

Alternatively, in some examples, before the deposition of the dielectric material in the trench, a sacrificial layer (e.g., a conformal material) may be deposited in the trench and, in some cases, the sacrificial layer fills the grooves. In other words, the conformal material may be formed between the conductive material and the dielectric material. The conformal material and the dielectric material may form a serpentine shape.

In the example where the conformal material is formed, portions of the dielectric material may be removed through an etching process (for example, a dry etching process) to form openings. The openings may expose portions of the substrate, the plurality of conductive contacts, and portions of the conformal materials and insulative materials. In some examples, the opening may be formed in an oval shape. In some examples, other geometric configurations of the opening are contemplated. For instance, rectangle openings may be formed. In some examples, walls of the dielectric material may be exposed in the openings. Another etching process (for example, an isotropic wet etching process) may be performed to enlarge the openings in each plane of the conductive material so that portions of the conformal material are etched away and arched recesses are formed in the conformal material and between the conductive material and the dielectric material. In some examples, the arched recesses are tangent (with a certain excess tolerance) to the conductive material. A storage element material (e.g., the chalcogenide material) may be deposited in the enlarged openings. The storage element material may be partially removed from the openings such that only the storage element materials in the arched recesses remain. In some examples, each of the recesses in an arch-shape may be formed by the conductive material, the conformal material, and the insulative material.

Conductive pillars may be formed in the openings that include the storage element materials in the recesses. In some examples, the storage element material may contact the conductive material at middle (for example, the arch crown) of the arched recess, while contacting the conductive pillar at the base (for example, a wider bottom part) of the arched recess. In some examples, the storage element material may contact the conformal material at opposite sides of the arched recess between the middle and the base. The conductive pillars may be examples of digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material.

In some examples, the contact area between the storage element material and the conductive material may be smaller than the contact area between the storage element material and the conductive pillar. In some examples, the contact area between the storage element material and the conductive material may be controlled by an alignment of the conductive pillar with respect to the conductive material. For example, if an average interception/contact is 17 nm with a conductive pillar radius equal to 20 nm, a fluctuation by +/−1 nm of its center may produce a contact size fluctuation by +/−4 nm. A proper over-recession can reduce this variability and allow a better dimensional control.

In some examples, the plurality of conductive pillars formed over the plurality of contacts may interrupt a continuity of the dielectric material extending over the substrate in the serpentine shape.

Such configurations of a memory array and the methods of manufacturing may allow a higher-density of memory cells and compacted memory cells relative to previous solutions. Each memory cell (e.g., storage element material) may be recessed inside opposite sides of the conductive pillar to ensure the cell isolation. Such a configuration may allow for a tighter control of cell thickness and dimension with respect to some previous solutions. Each plane of conductive material that intersects the conductive pillar may form two memory cells addressed by a first word line plate in the plane and a second word line plate in the plane. Each conductive pillar may be decoded by a transistor positioned at the bottom or top of the memory array. The transistor may be an example of a digit line selector formed in a regular matrix.

Features of the disclosure are initially described in the context of a memory array as described with reference to FIG. 1. Features of the disclosure are described in the context of different views of example 3D memory arrays during manufacturing steps as described with reference to FIGS. 2A-8. These and other features of the disclosure are further illustrated by and described with reference to flowcharts that relate to vertical 3D memory array architecture as described with references to FIGS. 9 and 10. These and other features of the disclosure are further described in the context of an example 3D memory device with reference to FIG. 11.

FIG. 1 illustrates an example of a 3D memory array 100 in accordance with aspects of the present disclosure. Memory array 100 may include a first array or deck 105 of memory cells that is positioned above a substrate 104 and a second array or deck 108 of memory cells on top of the first array or deck 105. In some examples, the memory array 100 may have a different orientation relative to the substrate 104, such as an orientation rotated 90° from the orientation shown in FIG. 1, where the first array or deck 105 of memory cells may be positioned adjacent to the second array or deck 108 of memory cells.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a vertical 3D cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a plurality of contacts arranged in a grid or staggered pattern. In some cases, the plurality of contacts may extend through the substrate and couple with an access line of the memory array 100. The memory array 100 may include a plurality of planes of a conductive material separated by one another by a second insulative material formed on the first insulative material on the substrate material. Each of the plurality of planes of the conductive material may include a plurality of grooves formed therein. The plurality of planes, for example, word line plates, may be obtained by a replacement process by using a sacrificial layer (e.g., a conformal layer) for etching during a stack deposition processing step, removing the conformal layer after cell definition and replacing the conformal layer with a more conductive material.

A dielectric material may be formed in a serpentine shape through the second insulative material and the conductive material. A plurality of conductive pillars may be arranged in openings to extend substantially perpendicular to the plurality of planes of the conductive material and the substrate. Each respective one of the plurality of conductive pillars may be coupled to a different one of the conductive contacts.

In some examples, the memory decks 105 and 108 may include chalcogenide material configured to store logic states. For example, the memory cells of the memory decks 105 and 108 may be examples of self-selecting memory cells. A chalcogenide material may be formed in the plurality of grooves such that the chalcogenide material in each respective one of the plurality of grooves is at least partially in contact with one of the plurality of conductive pillars.

FIG. 2A illustrates a bottom view of an example 3D memory array 200-a in accordance with examples as disclosed herein. The memory array 200-a may include a plurality of conductive contacts 235 formed in a substrate 104 and extend through the substrate 104 and couple with an access line of the memory array 100. For example, the substrate 104 may be a dielectric material, such as a dielectric film.

A single conductive contact of the plurality of conductive contacts 235 may be configured to couple any single vertical pillar with a transistor (not shown). The plurality of conductive contacts 235 may be arranged in a grid pattern. In some examples, a respective one of the plurality of conductive contacts 235 may be surrounded by up to eight other conductive contacts 235. In some examples, the plurality of conductive contacts 235 may be arranged in a staggered pattern or a hexagonal pattern. For example, a respective one of the plurality of conductive contacts 235 may be surrounded by up to six other conductive contacts 235.

Figure 2B:
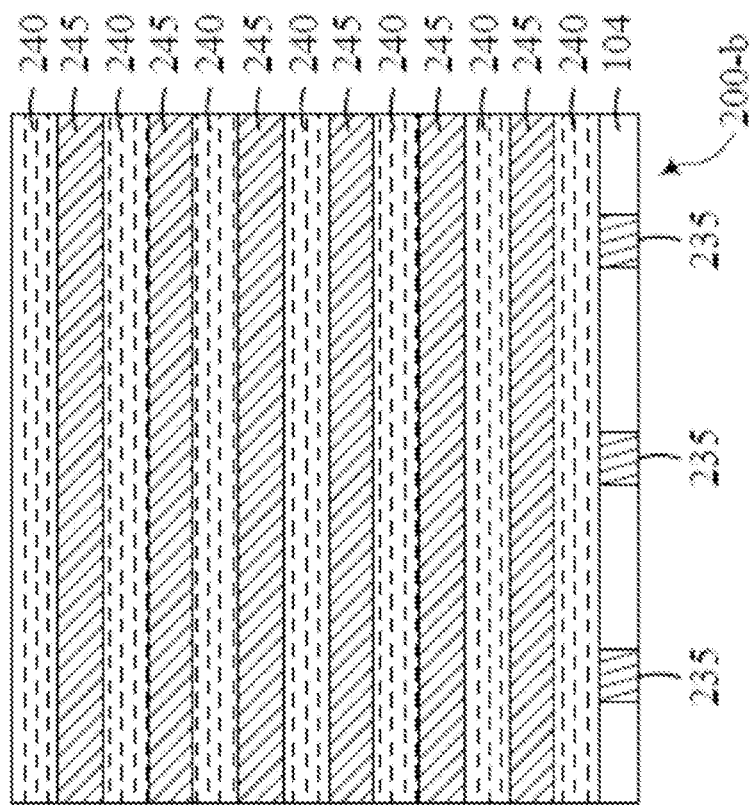
FIG. 2B illustrates a side view of an example 3D memory array in accordance with examples as disclosed herein.

FIG. 2B illustrates a side view of an example 3D memory array 200-b in accordance with examples as disclosed herein. The memory array 200-b may include plurality of conductive contacts 235 may be formed in the substrate 104. The memory array 200-b may also include a plurality of stacked planes of an insulative material 240 and a plurality of stacked planes of a conductive material 245 (e.g., word lines planes or word line plates). The stacked planes of conductive material 245 may be separated in a z-direction (e.g., separated vertically) from one another by the plurality of planes of the insulative material 240. For example, a first plane (e.g., a bottom plane) of the second insulative material 240 may be formed (e.g., deposited) on the plane of the substrate 104, and then a plane of the conductive material 245 may be formed on the first plane of the second insulative material 240. In some examples, a layer of the first insulative material 240 may be deposited on the substrate 104. In some examples, the conductive material 245 may be a layer of conductive carbon or other conductive layer compatible with active materials. In some examples, the conductive material 245 may include conductive layers separated by active material through a protective barrier. The conductive material 245 may be configured to function as at least one word line plate. In some examples, the conductive material 245 and the insulative material 240 form a plurality of layers, such as alternating layers.

Additional planes of the second insulative material 240 may be formed on the conductive material 245 in an alternating manner as illustrated in FIG. 2B. The second insulative material 240 may be a dielectric material, such as a dielectric film or layer. In some examples, the second insulative material 240 and the substrate 104 may be the same type of insulative material. Examples of the insulative materials disclosed herein include, but are not limited to dielectric materials, such as silicon oxide.

Each respective one of the plurality of planes of the conductive material 245 may be at (e.g., form) a different level of the 3D memory array 200-b. Individual planes of material that form memory cells may be referred to as a deck of the 3D memory array 200-b. The conductive material 245 may comprise (e.g., be formed of) a metallic (or semi-metallic) material or a semiconductor material such as a doped polysilicon material, among others. In some examples, the conductive material 245 may be a plane of conductive carbon.

Six planes of the conductive material 245 and seven planes of the second insulative material 240 are shown in FIG. 2B. The seventh plane of the second insulative material 240 may be a topmost layer of the 3D memory array 200-b. The quantity of planes of the conductive material 245 and the second insulative material 240 are not limited to the quantities illustrated in FIG. 2B. The conductive material 245 and the second insulative material 240 may be arranged into more than six decks or less than six decks.

Figure 3A:
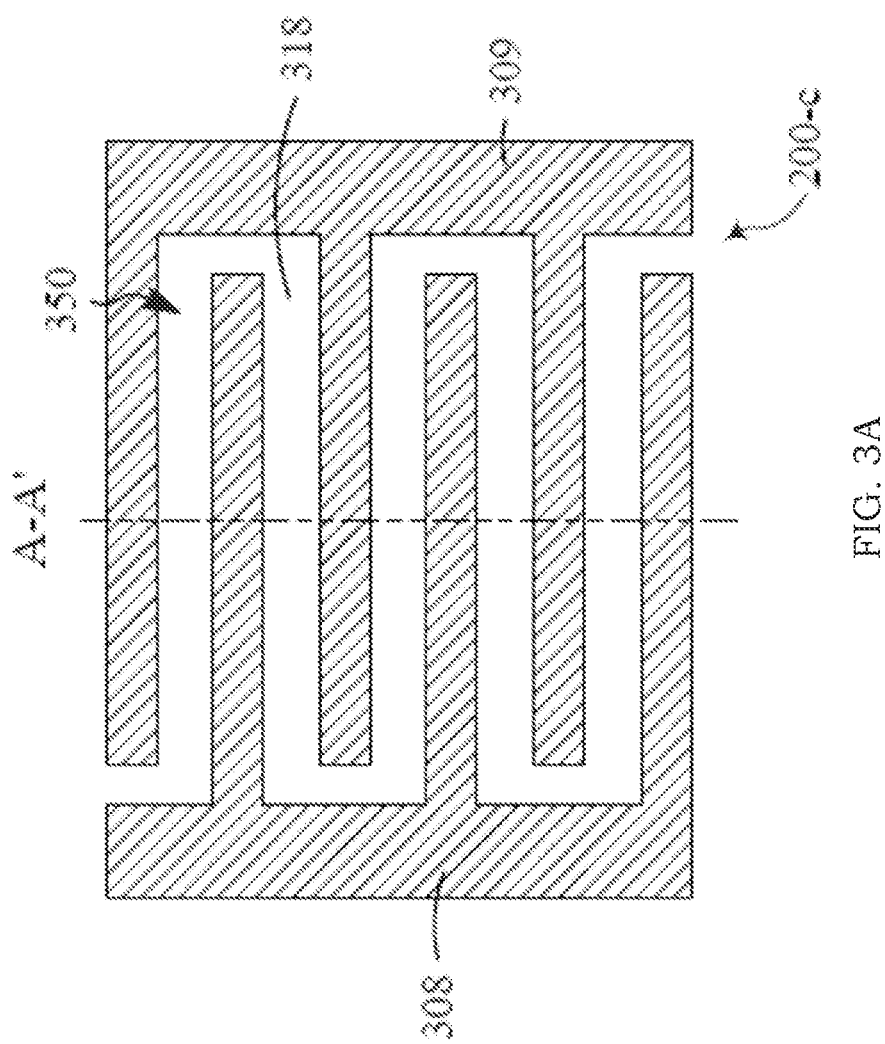
FIGS. 3A through 3D illustrate various views of example 3D memory array in accordance with examples as disclosed herein.
Figure 3B:
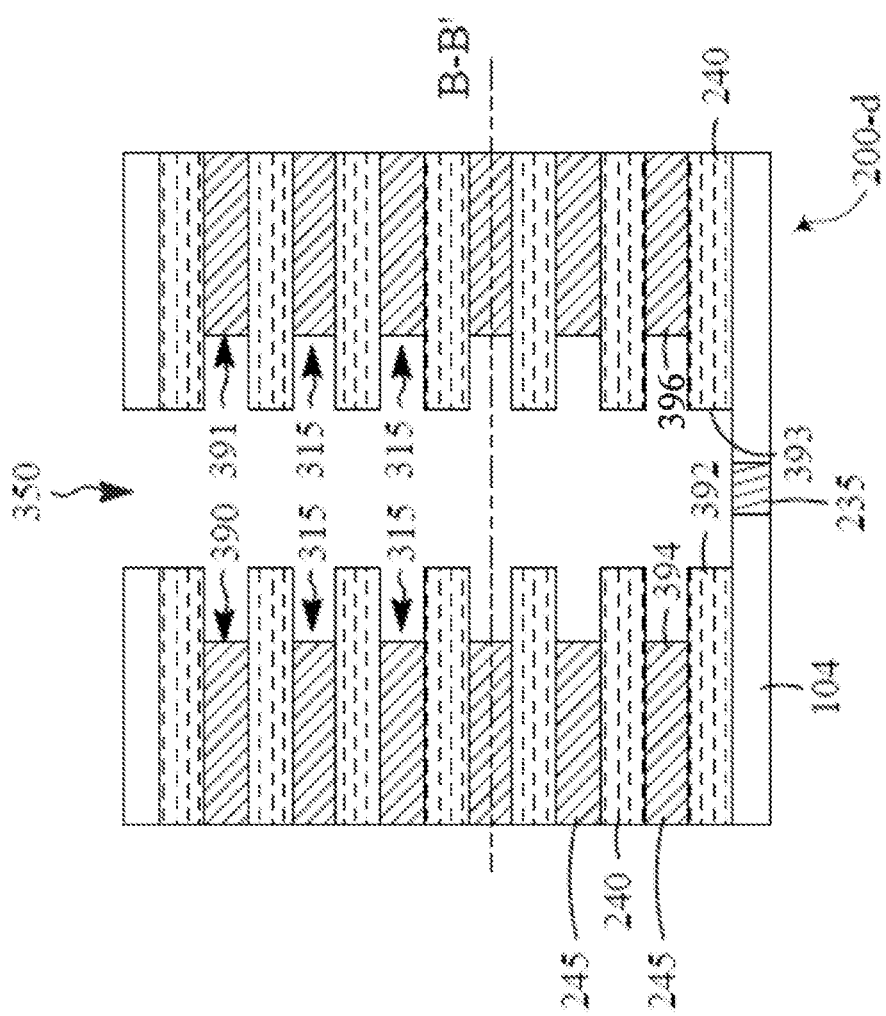
Figure 3C:
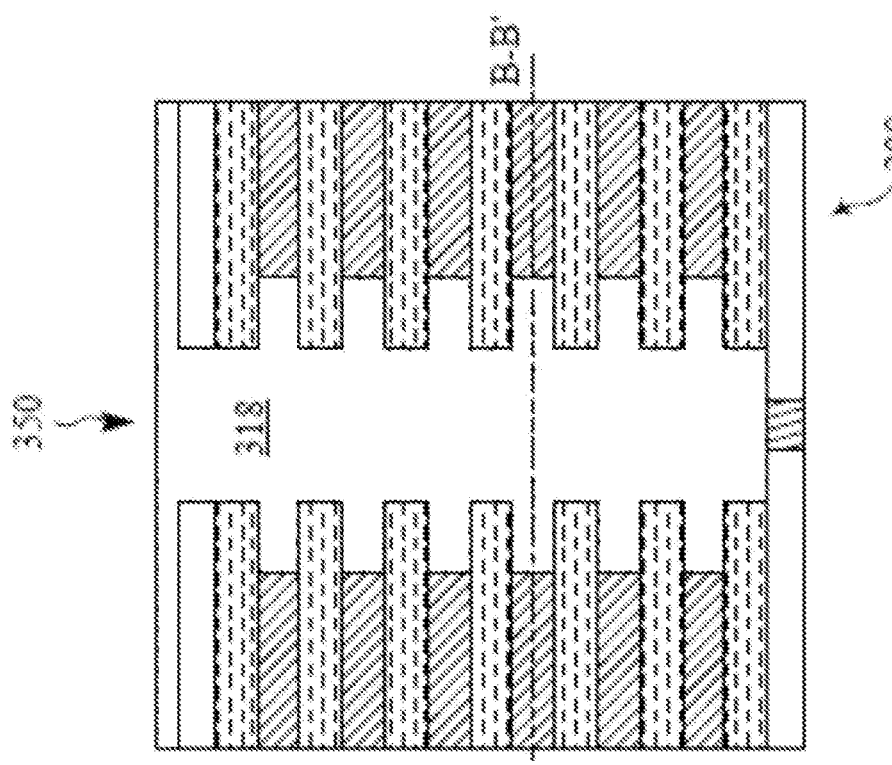
Figure 3D:
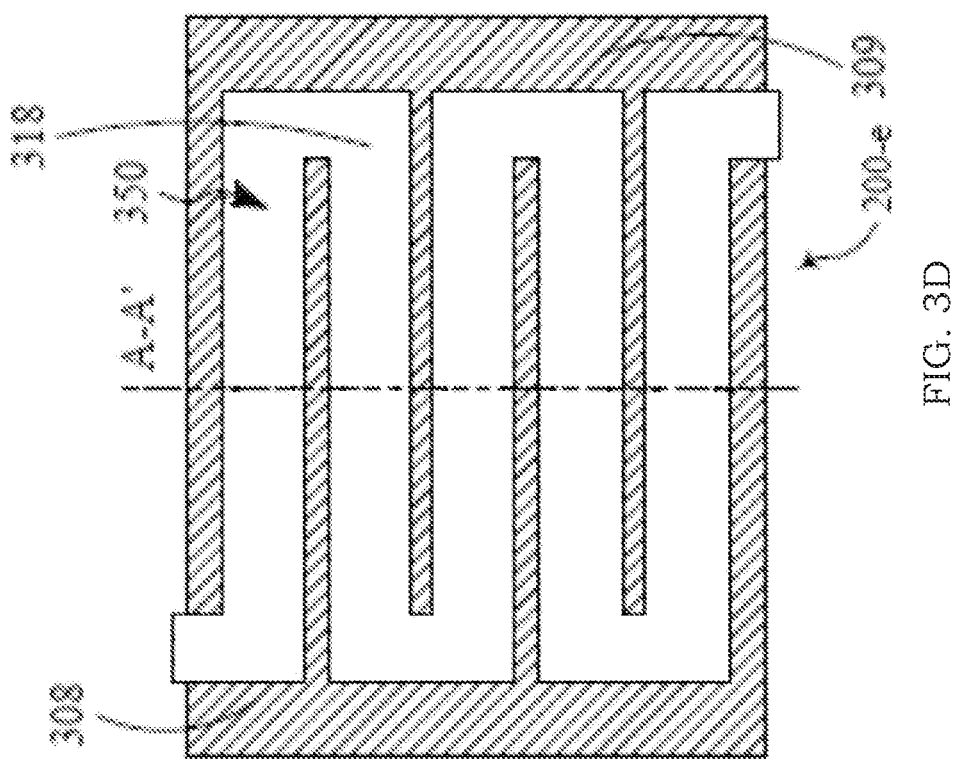

FIG. 3A illustrates a top view of an example 3D memory array 200-c, which may be an example of the memory array 200-b illustrated in FIG. 2B after a trench 350 is formed. FIG. 3B illustrates a cross-sectional view of an example 3D memory array 200-d along section line A-A' during a process step subsequent to what is illustrated in FIG. 3A. FIG. 3C illustrates a cross-sectional view of an example 3D memory array 200-e along section line A-A' during a process step subsequent to what is illustrated in FIG. 3B. FIG. 3D illustrates a top view of an example 3D memory array 200-e of section line B-B' during a process step subsequent to what is illustrated in FIG. 3B.

FIG. 3A illustrates forming the trench 350 through the alternating planes of conductive material 245 (shown in FIG. 3B) and the second insulative material 240 (shown in FIG. 3B) of memory array 200-c. The trench 350 may expose the substrate 104 (previously shown in FIGS. 2A and 2B) and the conductive contacts 235 (previously shown in FIGS. 2A and 2B) at the bottom of the trench 350.

The trench 350 may be etched from top to bottom and etched in a serpentine-shape. For instance, the trench 350 may pass over a row of the conductive contacts 235 in a first direction (e.g., from left to right) and then pass over an adjacent row of the conductive contacts 235 in a second direction that is opposite to the first direction (e.g., from right to left). With reference to the example of FIG. 3A, the trench 350 passes over a first row of the conductive contacts 235 from left to right, then "turns" and passes over the next (second) row of conductive contacts 235 (adjacent to the first row) from right to left. The trench 350 "turns" again and passes over the next (third) row of conductive contacts 235 (adjacent to the second row) from left to right. The trench 350 "turns" again and passes over the next (fourth) row of conductive contacts 235 (adjacent to the third row) from right to left and then "turns" again and passes over the next (fifth) row of conductive contacts 235 at the bottom of FIG. 3A (adjacent to the fourth row) from left to right.

The trench 350 may bifurcate each plane of the conductive material 245 into at least two portions: a first portion 308 and a second portion 309. Each portion of a plane of the conductive material 245 may be a different access line (e.g., even word line or odd word line) of a deck. For example, the first portion 308 may be a first access line of a deck of the 3D memory array 200-c and the second portion 309 may be a second access line of the same deck of the 3D memory array 200-c. The extension of the fingers forming the even or odd planes may be defined based on the resistivity of an electrode used and by the level of current delivery requested. Specifically, the depth of the grooves is defined depending on the thickness desired for the memory cell.

FIG. 3B illustrates forming a plurality of grooves 315 in the conductive material 245 in each of the planes of memory array 200-d. For example, a selective etching operation may be performed to form the plurality of grooves 315 in sidewalls 390 and 391 of the trench 350 in an isotropic way. In some examples, the trench 350 includes a first sidewall 390 spaced apart from a second sidewall 391, where a first portion 392 of the first sidewall 390 formed by the first insulative material 240 is spaced apart from a first portion 393 of the second sidewall 391 formed by the first insulative material 240 by a first distance. A second portion 394 of the first sidewall 390 formed by the first conductive material 245 may be spaced apart from a second portion 396 of the second sidewall 391 formed by the first conductive material 245 by a second distance greater than the first distance. In some examples, portions of sidewalls 390 and 391 of the trench 350 formed by the first conductive material 245 are recessed relative to portions of the sidewalls 390 and 391 of the trench 350 formed by the first insulative material 240.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 350 and a horizontal etching process may be used to form at least one groove 315 in at least one conductive material 245. The etching parameters may be selected such that the conductive material 245, for example, is etched faster than the second insulative material 240.

FIG. 3C illustrates depositing a dielectric material 318 in the trench 350. The dielectric material 318 may contact the sidewalls of the trench 350. The dielectric material 318 may fill the trench 350. In some cases, the dielectric material 318 may be an example of an insulative material.

FIG. 3D illustrates a top view of an example 3D memory array 200-e after the dielectric material 318 is deposited (as shown in FIG. 3C), in accordance with an example of the present disclosure. In FIG. 3D, the dielectric material 318 formed in the trench 350 bifurcates each plane of the conductive material 245 into a first portion 308 and a second portion 309.

Figure 4:
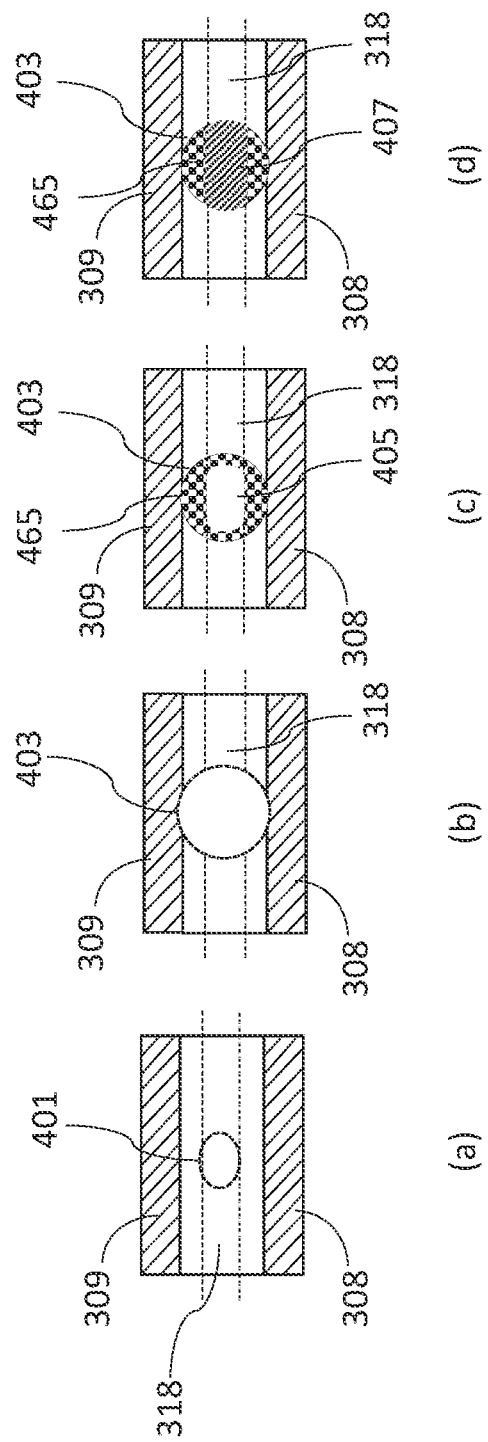
FIG. 4 illustrates various views of example 3D memory array in accordance with examples as disclosed herein.

FIG. 4 illustrates various partial views of an example 3D memory array 200-e shown in FIG. 3D. As shown in FIG. 4, the dashed lines indicate the masks. In (a) of FIG. 4, an opening 401 in the trench 350 may be formed by etching away a portion of the dielectric material 318. The opening 401 is intended to be positioned in alignment with a contact 235 so that forming the opening 401 exposes at least a portion of the contact 235 extending through the substrate 104 (shown in FIG. 3C). The etching process may be a vertical etching process. In some examples, the etching operation may be a dry etching process.

It should be noted that only one opening 401 is illustrated in FIG. 4 for a purpose of simplification. In fact, a plurality of openings 401 may be formed, each of which may be positioned in alignment with one of the plurality of contacts 235 shown in FIG. 2A for example.

In (b) of FIG. 4, after forming the opening 401, another etching process (for example, an isotropic wet etching process) may be performed to enlarge the opening 401 in each plane of the conductive material so that the enlarged opening 403 are tangent (with a certain excess tolerance) to the first portion 308 and the second portion 309 of the conductive material 245. In some examples, the wet etching process may etch away a portion of the dielectric material 318 and a portion of the conductive material 245 (for example, of the first portion 308 and the second portion 309).

In (c) of FIG. 4, a storage element material 465 (e.g., the chalcogenide material) may be deposited in the enlarged opening 403. In some examples, the enlarged opening filling may be favored by the top/bottom growth of the storage element material 465. In some examples, the storage element material may comprise an amorphous chalcogenide material configured to act both as a selector element and a storage element in the memory cell, that may be a self-selecting memory cell. In some examples, the storage element material 465 is configured not to change phase, e.g., it remains an amorphous material, when programmed in different logical states. After the deposition of the storage element material 465, a portion of the storage element material 465 may contact the first portion 308 and the second portion 309 of the conductive material 245. The storage element material 465 may be partially removed from the opening such that only the storage element material in recesses of an arch-shape remain. After removing portions of the storage element material 465, an opening 405 may be formed, which is communicated with the opening 401. In some examples, the storage element material 465 may be further etched to expose walls of the dielectric material 318 in the opening 405. As shown in (c) of FIG. 4, the arched recesses are positioned at opposite sides of the opening 405. In some examples, the arched recess may be defined by the conductive material 245 (for example, the first portion 308 and/or the second portion 309), the dielectric material 318, and the insulative material 240 (shown in FIG. 3B, for example).

In (d) of FIG. 4, a conductive pillar 407 may be formed in the opening 403 that include the storage element materials in the arched recesses. In some examples, the storage element material 465 may contact the conductive material 245 (for example, the first portion 308 and the second portion 309) at middle (for example, the arch crown) of the arched recess, while contacting the conductive pillar 407 at the base (for example, a wider bottom part) of the arched recess. In some examples, the storage element material 465 may contact the dielectric material 318 at opposite sides of the arched recess between the middle and the base. In some examples, the storage element material 465 may contact the insulative material 240 (shown in FIG. 3B) in a direction perpendicular to the plane of the conductive material 245. In other words, the storage element material 465 may be surrounded by the conductive material 245, the dielectric material 318, the conductive pillar 407, and the insulative material 240. The conductive pillar 407 may be example of a digit line. The conductive pillar 407 may be arranged to extend (e.g., substantially perpendicular) to the plane of the conductive material and the substrate.

It should be noted that only one conductive pillar 407 is illustrated in FIG. 4 for a purpose of simplification. In fact, a plurality of conductive pillars 407 may be formed, each of which may be positioned in alignment with one of the plurality of contacts 235 shown in FIG. 2A for example. In some examples, each conductive pillar 407 may be coupled with a different conductive contact. In some examples, the conductive pillars 407 may be formed of a barrier material and a conductive material, which will be described in detail below.

In some examples, the contact area between the storage element material 465 and the conductive material 245 (for example, the first portion 308 and/or the second portion 309) may be smaller than the contact area between the storage element material 465 and the conductive pillar 407. In other words, the storage element 465 may have a tapered profile in the direction from the digit line (e.g., the conductive pillar 407) to the word line (e.g., the first portion 308 and/or the second portion 309 of the conductive material 245). In some examples, the contact area between the storage element material 465 and the conductive material 245 (for example, the first portion 308 and/or the second portion 309) may be controlled by an alignment of the conductive pillar 407 with respect to the conductive material 245 (for example, the first portion 308 and/or the second portion 309). For example, if an average interception/contact is 17 nm with a conductive pillar radius equal to 20 nm, a fluctuation by +/−1 nm of its center may produce a contact size fluctuation by +/−4 nm. A proper over-recession can reduce this variability and allow a better dimensional control.

Figure 5A:
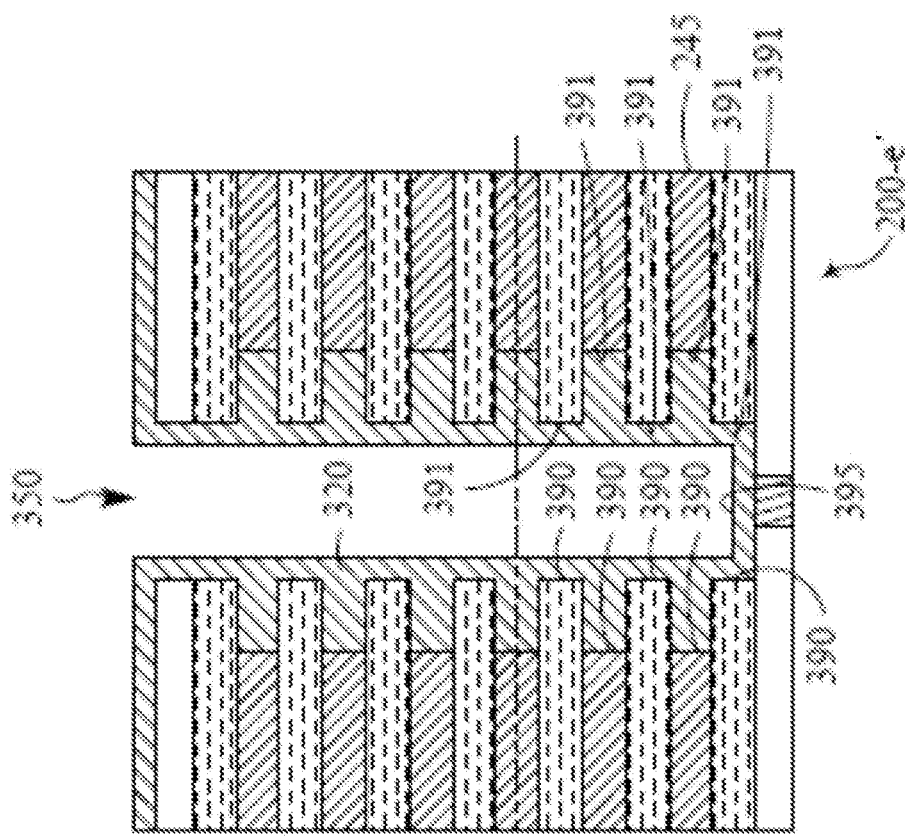
FIGS. 5A through 5C illustrate various views of example 3D memory arrays in accordance with examples as disclosed herein.
Figure 5B:
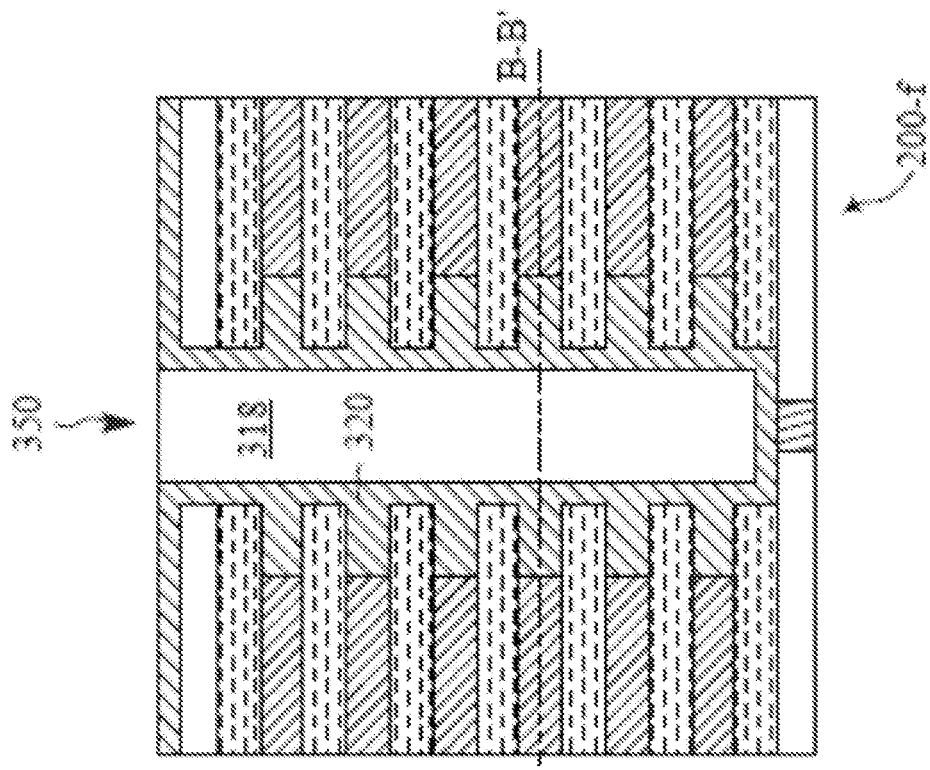
Figure 5C:
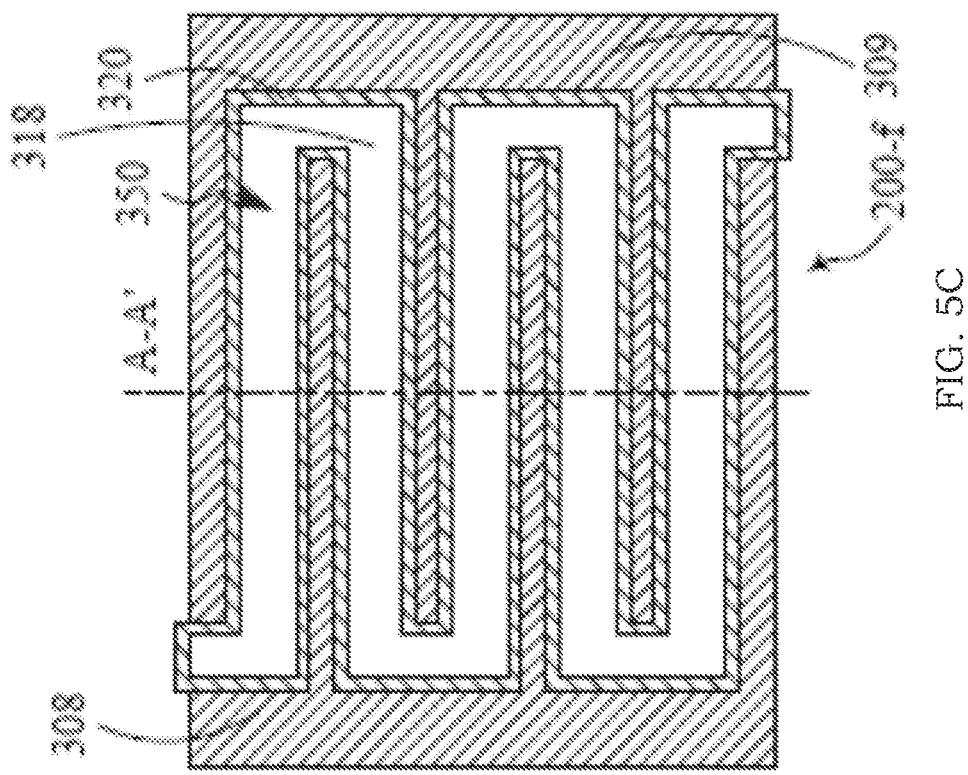
Figure 6:
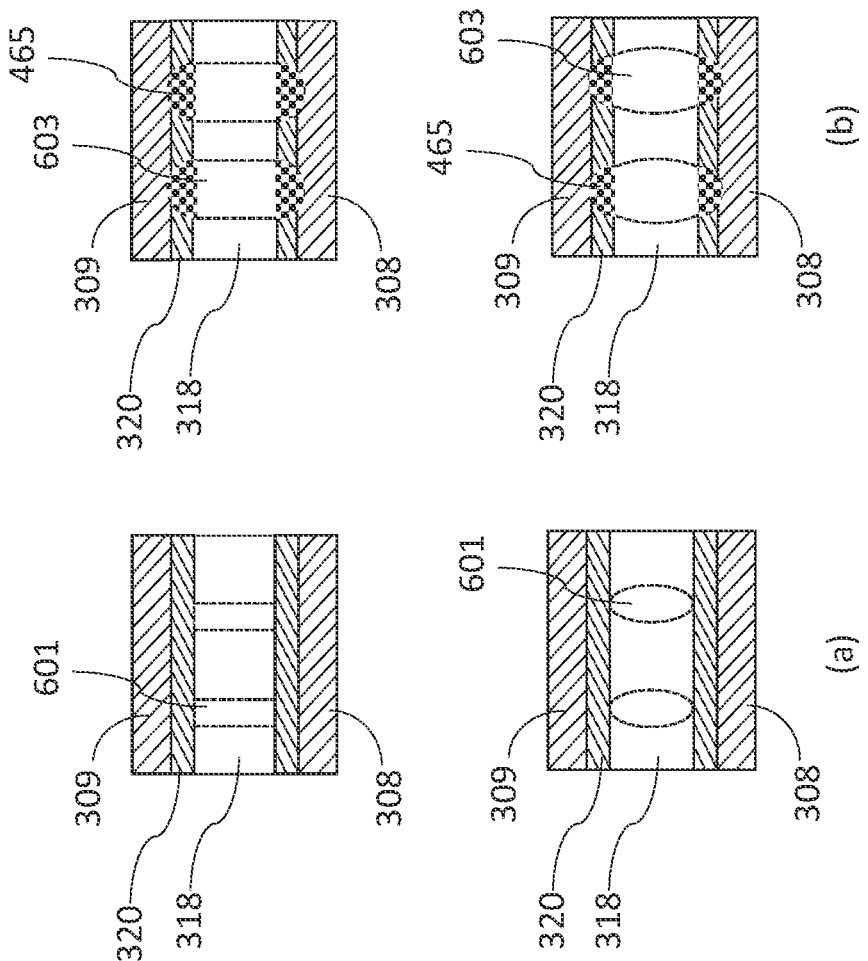
FIG. 6 illustrates various views of example 3D memory array in accordance with examples as disclosed herein.

FIGS. 5A through 6 illustrate another example of the present disclosure in which a conformal material 320 is formed between the conductive material 245 and the dielectric material 318. FIG. 5A illustrates forming a conformal material 320 (e.g., a sacrificial material or sacrificial layer). The conformal material 320 may be deposited into the trench 350 of memory array 200-*e'*. The conformal material 320 may be formed in the grooves 315 (shown in FIG. 3B) by conformally depositing the conformal material 320. The conformal material 320 contacts a first sidewall 390, a second sidewall 391, and a bottom wall 395 of each trench 350. Although FIG. 5A shows the conformal material 320 may be formed on the sidewalls of the trench 350 (e.g., on the surfaces of the second insulative material 240 and the conductive materials 245 in different layers facing into the trench 350) during formation of the conformal material 320 in the plurality of grooves 315, examples are not so limited. For example, the conformal material 320 may be confined to only the plurality of grooves 315 in the conductive materials 245 in different layers in some cases. In some cases, the conformal material 320 may be referred to as a conformal layer or a sacrificial layer.

In some cases, an etching operation may be performed subsequent to forming the conformal material 320. In the etching operation, the conformal material 320 may be etched to form an opening or trench 350. The etch operation may result in the surfaces of the conformal material 320 (e.g., the surfaces facing the trench 350) being spaced apart from the surfaces of the second insulative material 240 (e.g., the surfaces facing into the trench 350). In some cases, the etch operation may result in the surfaces of the conformal material 320 (e.g., the surfaces facing the trench 350) being approximately coplanar with surfaces of the second insulative material 240 (e.g., the surfaces facing into the trench 350), and thereby forming a continuous sidewall of trench.

The etching operations described herein may be vertical etching processes (e.g., an anisotropic etching process or a dry etching process, or a combination thereof) or horizontal etching processes (e.g., an isotropic etching process).

FIG. 5B illustrates depositing the dielectric material 318 in the trench 350 on top of the conformal material 320 of the memory array 200-f. The dielectric material 318 may contact the conformal material 320. The dielectric material 318 and the conformal material 320 may cooperate to fill the trench 350. In some cases, the dielectric material 318 may be an example of an insulative material. In some examples, the conformal material 320 may be etched back selectively to form a co-planar surface with the dielectric material 318. The depth of the recession may be defined depending on a desired thickness.

FIG. 5C illustrates a top view of an example 3D memory array 200-f after the dielectric material 318 is deposited (as shown in FIG. 5B), in accordance with an example of the present disclosure. In FIG. 5C, the conformal material 320 formed in the trench 350 and the dielectric material 318 bifurcates each plane of the conductive material 245 into a first portion 308 and a second portion 309.

FIG. 6 illustrates various partial views of an example 3D memory array 200-f shown in FIG. 5C. In (a) of FIG. 6, two openings 601 in the trench 350 may be formed by etching away portions of the dielectric material 318. In some examples, the etching may comprise a selective etching process, e.g., an etching process that removes the dielectric material 318 at a higher rate than it removes the conformal material 320, for example. The two openings 601 are intended to be positioned in alignment with a contact 235 so that forming the openings 601 exposes at least a portion of the contact 235 extending through the substrate 104 (shown in FIG. 3C). The etching process may be a vertical etching process. In some examples, the etching operation may be a dry etching process. In some examples, the opening 601 may be surrounded by the dielectric material 318 and the conformal material 320.

It should be noted that only two openings 601 are illustrated in FIG. 6 for a purpose of simplification. In fact, a plurality of openings 601 may be formed, every two or more of which may be positioned in alignment with one of the plurality of contacts 235 shown in FIG. 2A, for example. In this way, the density of conductive pillars to be formed in the openings 601 and coupled with the contacts 235 may be increased.

In some examples, the openings 601 may expose portions of the substrate 104, the plurality of conductive contacts 235, and portions of the conformal materials 320 and insulative materials 240. In some examples, the opening 601 may be formed in an oval shape, as depicted in the bottom portion of FIG. 6 (a). In some examples, other geometric configurations of the opening are contemplated. For instance, rectangle openings may be formed, as depicted in the top portion of FIG. 6 (a). In some examples, walls of the dielectric material 318 may be exposed in the openings 601.

In (b) of FIG. 6, the formation of the storage element material 465 in arched recesses is shown. In some examples, after forming the openings 601, another etching process (for example, an isotropic wet etching process) may be performed to enlarge the openings 601 in each plane of the conductive material 245 so that portions of the conformal material 320 are etched away and arched recesses are formed in the conformal material 320 and between the conductive material 245 (for example, the first portion 308 and/or the second portion 309) and the dielectric material 318. In some examples, the arched recesses are tangent (with a certain excess tolerance) to the conductive material 245 (for example, the first portion 308 and/or the second portion 309). The storage element material 465 (e.g., the chalcogenide material) may be deposited in the enlarged openings 603. The storage element material 465 may be partially removed from the openings 603 such that only the storage element material 465 in the arched recesses remain. In some examples, the storage element material 465 in the arched recesses may contact the conductive material 245 (for example, the first portion 308 and/or the second portion 309) at middle (e.g., the arch crown) of the recess, contact the conformal material 320 at opposite sides of the recess between the middle and base (e.g., a wider bottom part), contact the insulative material 240 in a direction perpendicular to the plane of the conductive material 245. In some examples, each of the arched recesses may be defined by the conductive material 245, the conformal material 320, and the insulative material 240.

In some examples, conductive pillars (not shown in FIG. 6) may be formed in the openings 603 that include the storage element material 465 in the arched recesses. In some examples, the storage element material 465 may contact the conductive material 245 at middle (for example, the arch crown) of the arched recess, while contacting the conductive pillar at the base (for example, the wider bottom part) of the arched recess. In some examples, the storage element material 465 may contact the conformal material 320 at opposite sides of the arched recess between the middle and the base. The conductive pillars may be examples of digit lines. The conductive pillars may be arranged to extend (e.g., substantially perpendicular) to the planes of the conductive material 245 and the substrate 104. In some examples, each conductive pillar may be coupled with a different conductive contact 235. In some examples, the conductive pillar may be formed of a barrier material and a conductive material, which will be described in detail below.

In some examples, the contact area between the storage element material 465 and the conductive material 245 (for example, the first portion 308 and/or the second portion 309) may be smaller than that between the storage element material 465 and the conductive pillar (not shown in FIG. 6). In other words, the storage element 465 may have a tapered profile in the direction from the digit line (e.g., the conductive pillar) to the word line (e.g., the first portion 308 and/or the second portion 309 of the conductive material 245). In some examples, the contact area between the storage element material 465 and the conductive material 245 (for example, the first portion 308 and/or the second portion 309) may be controlled by an alignment of the conductive pillar with respect to the conductive material 245 (for example, the first portion 308 and/or the second portion 309). For example, if an average interception/contact is 17 nm with a conductive pillar radius equal to 20 nm, a fluctuation by +/−1 nm of its center may produce a contact size fluctuation by +/−4 nm. A proper over-recession can reduce this variability and allow a better dimensional control.

Figure 7A:
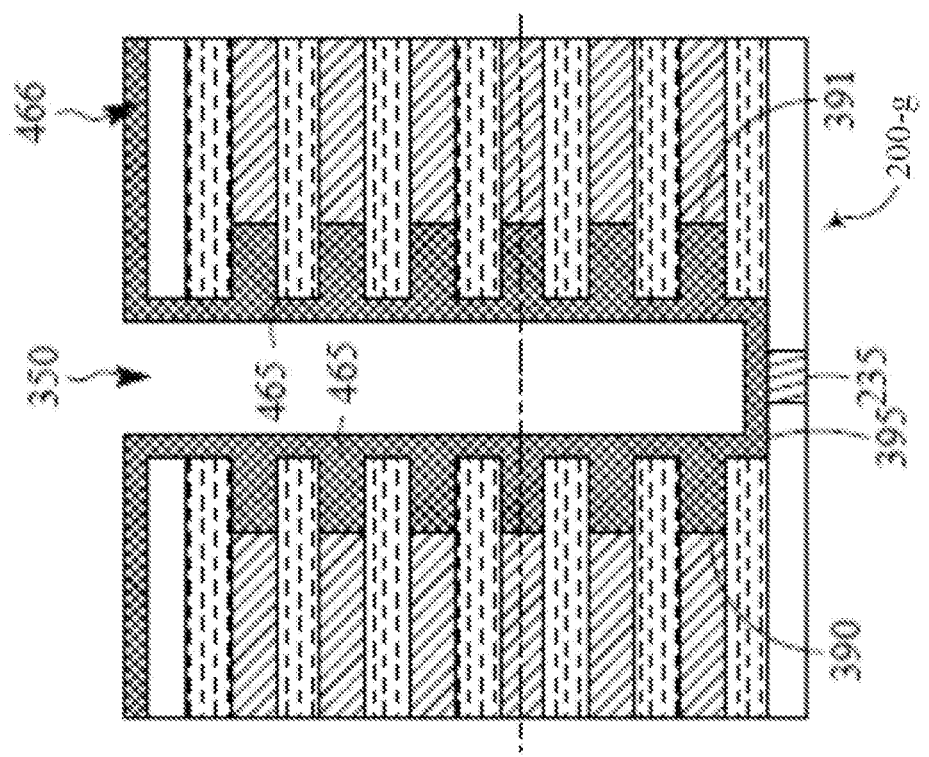
FIGS. 7A and 7B illustrate various views of example 3D memory array in accordance with examples as disclosed herein.
Figure 7B:
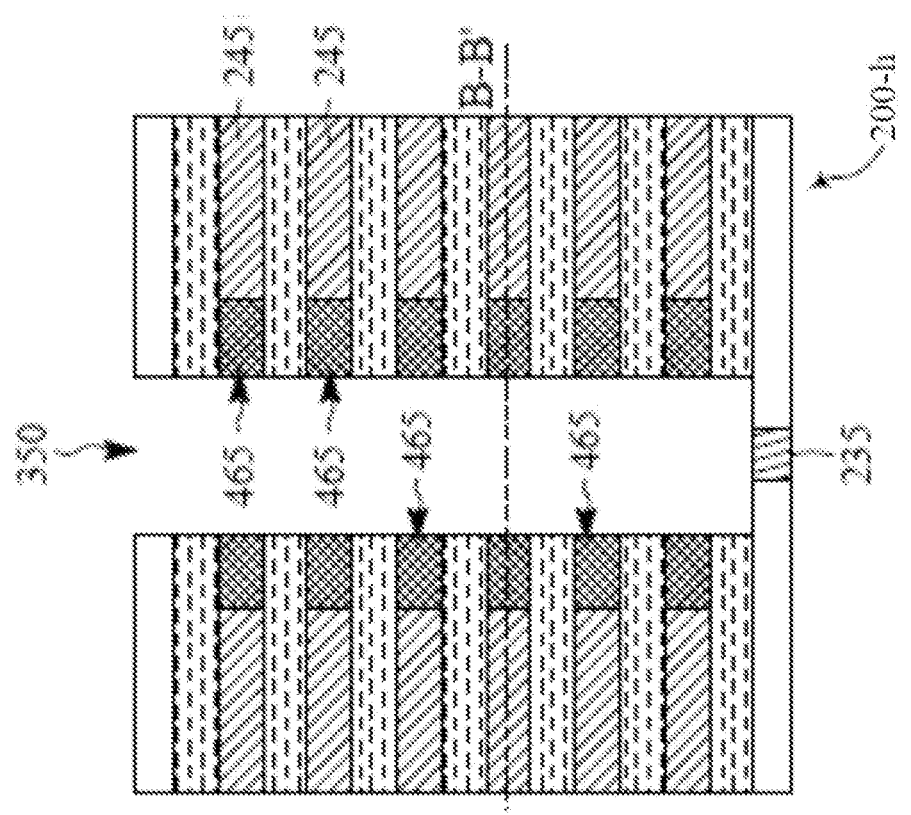

FIGS. 7A and 7B illustrate forming the storage element material 465 in the arched recesses in each of the planes of the conductive material 245. As shown in FIG. 7A, the storage element material 465 may be formed in the plurality of arched recesses by conformally depositing the storage element material 465 into the openings 401 and/or 601 (shown in FIGS. 4 and 6) in the trench 350. The storage element material 465 may be deposited to contact sidewalls 390 and 391 and a bottom wall 395 of the trench 350 exposed by the etching of the dielectric material 310 and/or the conformal material 320. When the storage element material 465 contacts the bottom wall 395 of the trench 350, the storage element material 465 covers the exposed contacts 235.

The storage element material 465 may be an example of a chalcogenide material, such as a chalcogenide alloy and/or glass, that may serve as a self-selecting storage element material (e.g., a material that may serve as both a select device and a storage element). For example, the storage element material 465 may be responsive to an applied voltage, such as a program pulse. For an applied voltage that is less than a threshold voltage, the storage element material 465 may remain in an electrically nonconductive state (e.g., an "off" state). Alternatively, responsive to an applied voltage that is greater than the threshold voltage, the storage element material 465 may enter an electrically conductive state (e.g., an "on" state).

The storage element material 465 may be programmed to a target state by applying a pulse (e.g., a programming pulse) that satisfies a programming threshold. The amplitude, shape, or other characteristics of the programming pulse may be configured to cause the storage element material 465 to exhibit the target state. For example, after applying the programming pulse, the ions of the storage element material 465 may be redistributed throughout the storage element, thereby altering a resistance of the memory cell detected when a read pulse is applied. In some cases, the threshold voltage of the storage element material 465 may vary based on applying the programming pulse.

The state stored by the storage element material 465 may be sensed, detected, or read by applying read pulse to the storage element material 465. The amplitude, shape, or other characteristics of the read pulse may be configured to allow a sense component to determine what state is stored on the storage element material 465. For example, in some cases, the amplitude of the read pulse is configured to be at a level that the storage element material 465 will be in an "on" state (e.g., current is conducted through the material) for a first state but will be in an "off" state (e.g., little to no current is conducted through the material) for a second state.

In some cases, the polarity of the pulse (whether programming or read) applied to the storage element material 465 may affect the outcomes of the operation being performed. For example, if the storage element material 465 stores a first state, a read pulse of a first polarity may result in the storage element material 465 exhibiting an "on" state while a read pulse of a second polarity may result in the storage element material 465 exhibiting an "off" state. This may occur because of the asymmetrical distributions of ions or other material in the storage element material 465 when it is storing a state. Similar principles apply to programming pulses and other pulses or voltages.

Examples of chalcogenide materials that may serve as the storage element material 465 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some examples, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

As shown in FIG. 7B, an etching operation may be performed subsequent to forming the storage element material 465 so that surfaces of the storage element material 465 (e.g., the surfaces facing into the trench 350 or the openings 401/601 (not shown in FIG. 7B)) is approximately coplanar with surfaces of the insulative material 240 (e.g., the surfaces facing into the trench 350). The etching of the storage element material 465 may form a continuous sidewall and remove the top layer 466 (shown in FIG. 7A) of the storage element material 465, whereby cells of the storage element material 465 are formed in the arched recesses only. In each recess, each cell of the storage element material 465 may contact a single conductive material 245 (e.g., a single conductive material 245 located adjacent to the cell of the storage element material 465) and at least two insulative material layers (e.g. a top insulative material layer and a bottom insulative material layer located on top of the cell of the storage element material 465 and on bottom of the cell of the storage element material 465). The etching of the storage element material 465 may provide a configuration in which the storage element material 465 are separated from one another. The etching of the storage element material 465 may also expose the contacts 235 in the substrate 104.

Figure 8:
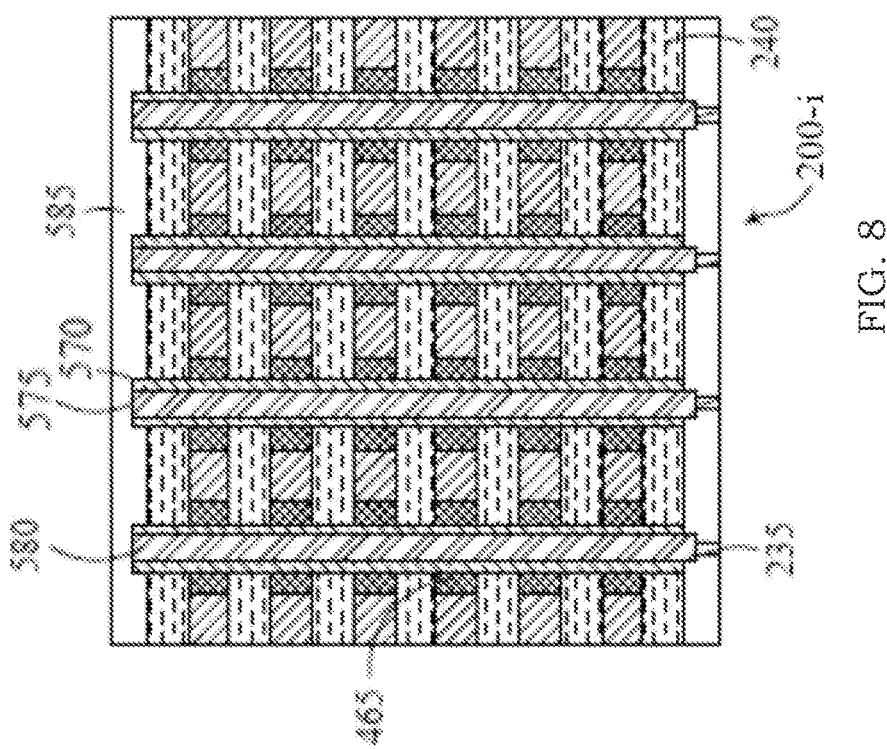
FIG. 8 illustrates a side view of an example 3D memory array in accordance with examples as disclosed herein.

FIG. 8 illustrates a side view of an example 3D memory array 200-i in accordance with an example of the present disclosure. In FIG. 8, conductive pillars 580 may be formed in the openings 401 and/or 601 shown in FIGS. 4 and 6. In some examples, a conductive material 575 may deposited in the openings to form conductive pillars 580. In some examples, the conductive pillars 580 may include a barrier material 570 and the conductive material 575. As illustrated in FIG. 8, a capping layer 585 (e.g., an insulative material, such as a dielectric layer) may be deposited to cap the conductive pillars 580 of memory array 200-i. In some examples the conductive pillar 508 may be the conductive pillar 407 shown in FIG. 4 and the conductive pillar of the examples shown in FIG. 6.

The memory array 200-i may include a plurality of vertical stacks. Each respective stack may include the conductive pillar 580, a conductive contact 235 coupled to the conductive pillar 580, the storage element material 465 formed in contact with the first portion 308 and the conductive pillar 580, and the storage element material 465 formed in contact with the second portion 309 and the conductive pillar 580.

The conductive pillar 580 may be in contact with the conductive contact 235 and the insulative material 240, and in contact with the storage element material 465. In some cases, the storage element material 465 is formed partially (e.g., not completely) around the conductive pillar 580.

Although not shown in FIG. 8 for clarity and so as not to obscure examples of the present disclosure, other materials may be formed before, after, and/or between the storage element material 465, and/or the conductive pillar 580, for example, to form adhesion layers or barriers against interdiffusion of materials and/or to mitigate composition mixing.

Figure 9:
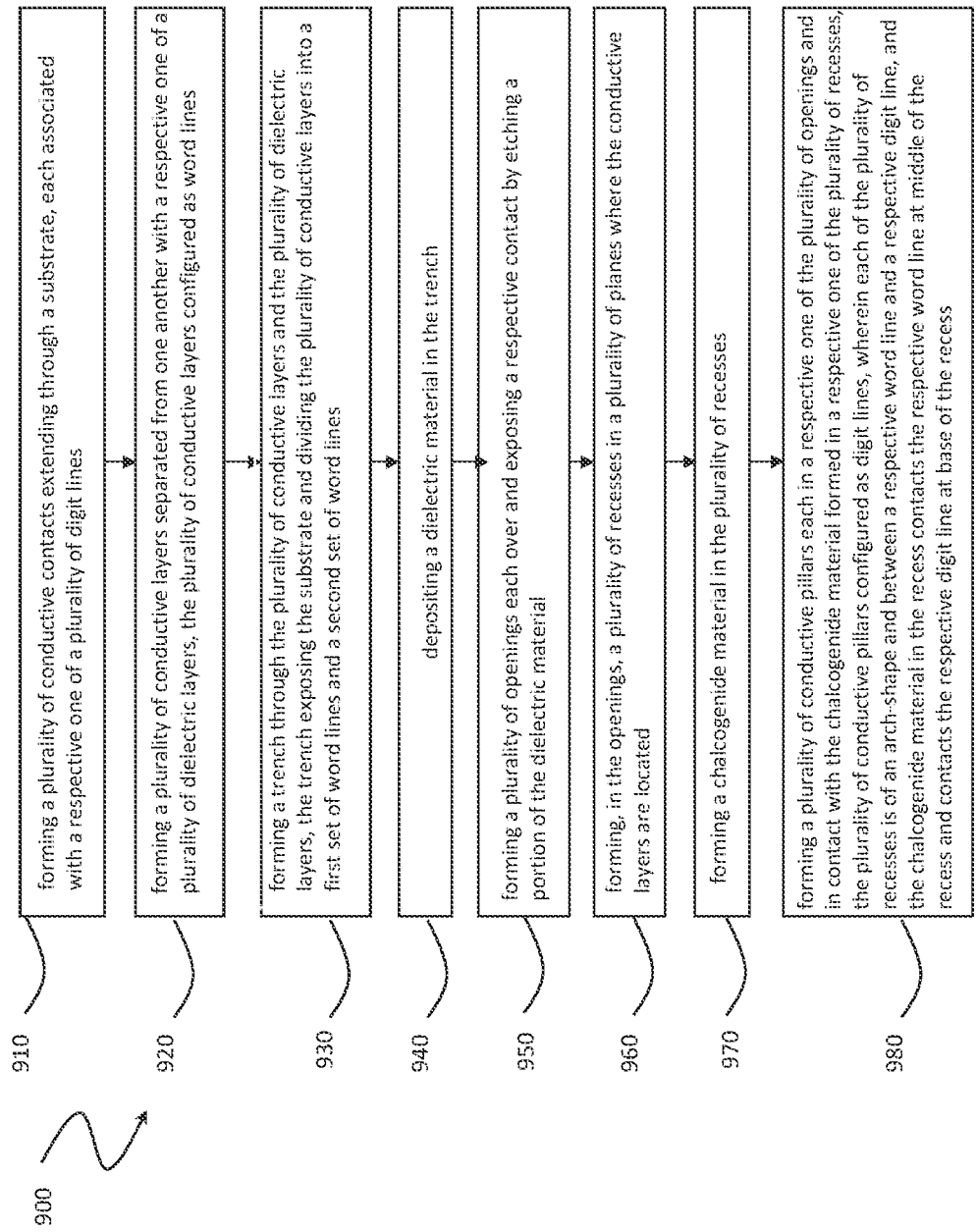
FIG. 9 shows a flowchart illustrating a method of manufacturing a 3D memory array in accordance with examples as disclosed herein.

FIG. 9 shows a flowchart illustrating a method 900 for manufacturing a 3D memory array in accordance with aspects of the present disclosure. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At S910, the method 900 may include forming a plurality of conductive contacts extending through a substrate, each associated with a respective one of a plurality of digit lines. The operations of S910 may be performed according to the method described herein.

At S920, the method 900 may include forming a plurality of conductive layers separated from one another with a respective one of a plurality of dielectric layers, the plurality of conductive layers configured as word lines. The operations of S920 may be performed according to the method described herein.

At S930, the method 900 may include forming a trench through the plurality of conductive layers and the plurality of dielectric layers, the trench exposing the substrate and dividing the plurality of conductive layers into a first set of word lines and a second set of word lines. The operations of S930 may be performed according to the method described herein.

At S940, the method 900 may include depositing a dielectric material in the trench. The operations of S940 may be performed according to the method described herein.

At S950, the method 900 may include forming a plurality of openings each over and exposing a respective contact by etching a portion of the dielectric material. The operations of S950 may be performed according to the method described herein.

At S960, the method 900 may include forming, in the openings, a plurality of recesses in a plurality of planes where the conductive layers are located. The operations of S960 may be performed according to the method described herein.

At S970, the method 900 may include forming a chalcogenide material in the plurality of recesses. The operations of S970 may be performed according to the method described herein.

At S980, the method 900 may include forming a plurality of conductive pillars each in a respective one of the plurality of openings and in contact with the chalcogenide material formed in a respective one of the plurality of recesses, the plurality of conductive pillars configured as digit lines, wherein each of the plurality of recesses is of an arch-shape and between a respective word line and a respective digit line, and the chalcogenide material in the recess contacts the respective word line at middle of the recess and contacts the respective digit line at base of the recess. The operations of S980 may be performed according to the method described herein.

In some examples, a contact area between the chalcogenide material and the respective word line may be smaller than that between the chalcogenide material and the respective digit line.

In some examples, the contact area between the chalcogenide material and the respective word line may be controlled by an alignment of the respective digit line with respect to the respective word line.

In some examples, the chalcogenide material in the recess may contact the dielectric material at opposite sides of the recess between the middle and the base.

Additionally or alternatively, the method 900 for manufacturing a 3D memory array may further comprise forming a conformal material between the dielectric material and the first and second set of word lines, respectively, and wherein the chalcogenide material in the recess may contact the conformal material at opposite sides of the recess between the middle and the base.

In some examples, the step of forming the openings may comprise performing a vertical etching process to vertically etch the dielectric material, and wherein the vertical etching process may be a dry etching process.

In some examples, the step of forming the recesses may comprise performing a horizontal etching process after the vertical etching process to form at least one recess in the plane where the conductive layer is located, and wherein the horizontal etching process may be an isotropic wet etching process.

In some examples, a conductive pillar of the plurality of conductive pillars may further comprise a barrier layer contacting at least portions of the chalcogenide material and a conductive material contacting the barrier layer.

In some examples, the plurality of conductive pillars formed over the plurality of contacts may interrupt a continuity of the dielectric material extending over the substrate in the serpentine shape.

In some examples, the step of forming the trench may comprise performing a vertical etching process to vertically etch the trench, and performing a horizontal etching process after the vertical etching process to form at least one groove in the conductive layer.

In some examples, the trench may comprise a first sidewall spaced apart from a second sidewall, wherein a first portion of the first sidewall formed by the dielectric layers is spaced apart from a first portion of the second sidewall formed by the dielectric layers by a first distance, and a second portion of the first sidewall formed by the conductive layers is spaced apart from a second portion of the second sidewall formed by the conductive layers by a second distance greater than the first distance.

Figure 10:
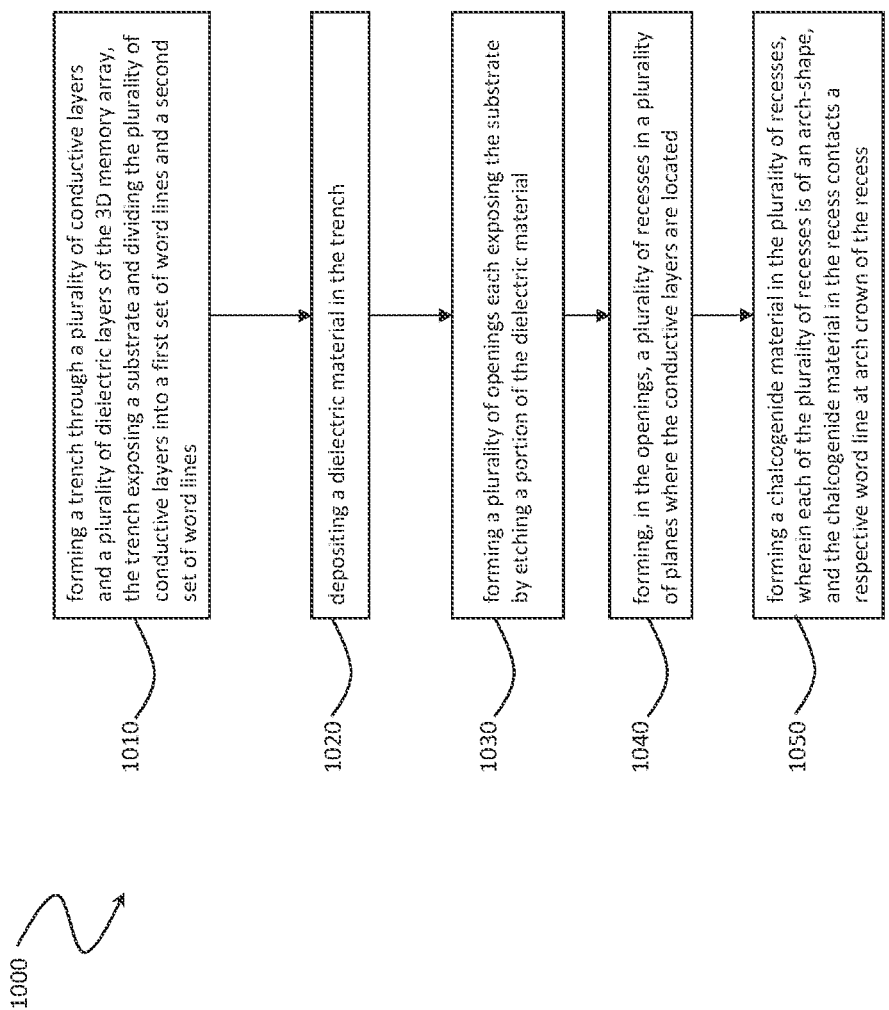
FIG. 10 shows a flowchart illustrating another method of manufacturing a 3D memory array in accordance with examples as disclosed herein.

FIG. 10 shows a flowchart illustrating another method 1000 for manufacturing a 3D memory array in accordance with aspects of the present disclosure. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At S1010, the method 1000 may include forming a trench through a plurality of conductive layers and a plurality of dielectric layers of the 3D memory array, the trench exposing a substrate and dividing the plurality of conductive layers into a first set of word lines and a second set of word lines. The operations of S1010 may be performed according to the method described herein.

At S1020, the method 1000 may include depositing a dielectric material in the trench. The operations of S1020 may be performed according to the method described herein.

At S1030, the method 1000 may include forming a plurality of openings each exposing the substrate by etching a portion of the dielectric material. The operations of S1030 may be performed according to the method described herein.

At S1040, the method 1000 may include forming, in the openings, a plurality of recesses in a plurality of planes where the conductive layers are located. The operations of S1040 may be performed according to the method described herein.

At S1050, the method 1000 may include forming a chalcogenide material in the plurality of recesses, and wherein each of the plurality of recesses is of an arch-shape, and the chalcogenide material in the recess contacts a respective word line at arch crown of the recess. The operations of S1050 may be performed according to the method described herein.

Additionally or alternatively, the method 1000 for manufacturing a 3D memory array may further comprise forming a plurality of conductive pillars each in a respective one of the plurality of openings and in contact with the chalcogenide material formed in a respective one of the plurality of recesses, the plurality of conductive pillars configured as digit lines, and wherein each of the plurality of recesses is between a respective word line and a respective digit line, and the chalcogenide material in the recess further contacts the respective digit line at base of the recess.

In some examples, a contact area between the chalcogenide material and the respective word line may be smaller than that between the chalcogenide material and the respective digit line.

In some examples, the contact area between the chalcogenide material and the respective word line may be controlled by an alignment of the respective digit line with respect to the respective word line.

In some examples, the chalcogenide material in the recess may contact the dielectric material at opposite sides of the recess between the arch crown and the base.

Alternatively, the method 1000 for manufacturing a 3D memory array may further comprise forming a conformal material between the dielectric material and the first and second set of word lines, respectively, and wherein the chalcogenide material in the recess contacts the conformal material at opposite sides of the recess adjacent to the arch crown.

In some examples, the step of forming the chalcogenide material may comprise depositing an amorphous chalcogenide material configured to act both as a selector element and a storage element in the memory cell, that may be a self-selecting memory cell. In some examples, the storage element material is configured not to change phase, e.g., it remains an amorphous material, when programmed in different logical states.

Figure 11:
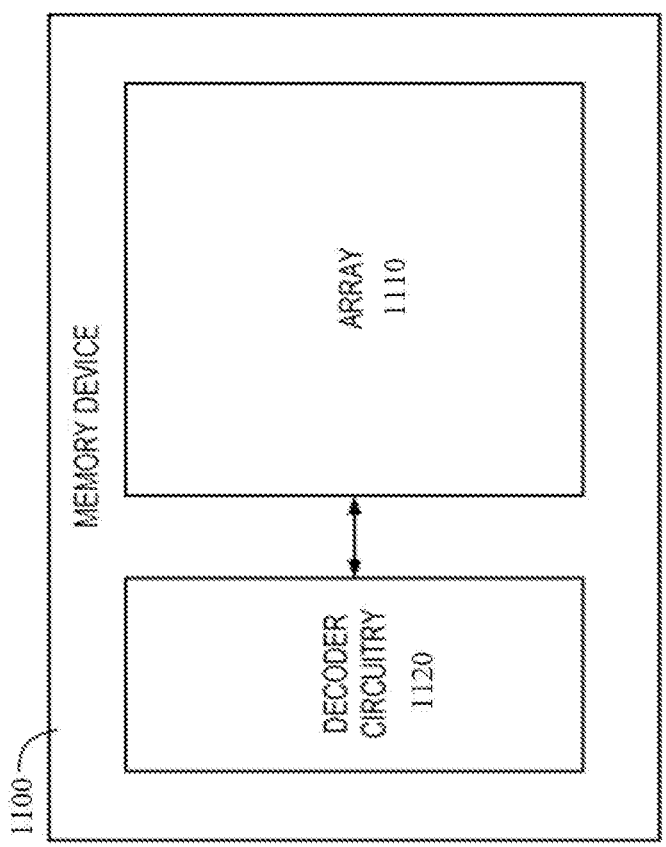
FIG. 11 is a block diagram of an apparatus in the form of a memory device in accordance with examples as disclosed herein.

FIG. 11 is a block diagram of an apparatus in the form of a memory device 1100 in accordance with examples as disclosed herein. As used herein, an "apparatus" can refer to, but is not limited to, any of a variety of structures or combinations of structures, such as a circuit or circuitry, a die or dies, a module or modules, a device or devices, or a system or systems, for example. As shown in FIG. 11, the memory device 1100 can include a 3D memory array 1110. The 3D memory array 1110 can be analogous the 3D memory array 200-i previously described in connection with FIG. 8. Although FIG. 11 shows a single 3D memory array 1110 for clarity and so as not to obscure examples of the present disclosure, the memory device 1100 may include any number of the 3D memory array 1110.

As shown in FIG. 11, the memory device 1100 can include decoding circuitry 1120 coupled to the 3D memory array 1110. The decoding circuitry 1120 can be included on the same physical device (e.g., the same die) as the 3D memory array 1110. The decoding circuitry 1120 can be included on a separate physical device that is communicatively coupled to the physical device that includes the 3D memory array 1110.

The decoding circuitry 1120 can receive and decode address signals to access the memory cells as mentioned above with reference to FIG. 1 of the 3D memory array 1110 during program and/or sense operations performed on the 3D memory array 1110. For example, the decoding circuitry 1120 can include portions of decoder circuitry for use in selecting a particular memory cell of the 3D memory array 1110 to access during a program or sense operation. For instance, a first portion of the decoder circuitry can be used to select a word line and a second portion of the decoder circuitry can be used to select a digit line.

The example illustrated in FIG. 11 can include additional circuitry, logic, and/or components not illustrated so as not to obscure examples of the present disclosure. For example, the memory device 1100 can include a controller to send commands to perform operation on the 3D memory array 1110, such as operations to sense (e.g., read), program (e.g., write), move, and/or erase data, among other operations. Further, the memory device 1100 can include address circuitry to latch address signals provided over input/output (I/O) connectors through I/O circuitry. Further, the memory device 1100 can include a main memory, such as, for instance, a DRAM or SDRAM, that is separate from and/or in addition to the memory array 1110.

A vertical 3D memory device is described. In some examples, the vertical 3D memory device may include a plurality of contacts associated with a plurality of digit lines and extending through a substrate, a plurality of word line plates separated from one another by respective dielectric layers and including a first plurality of word line plates and a second plurality of word line plates, a dielectric material positioned between the first plurality of word line plates and the second plurality of word line plates, the dielectric material extending in a serpentine shape over the substrate, a plurality of pillars formed over and coupled with the plurality of contacts, and a plurality of storage elements each comprising chalcogenide material positioned in a recess between a respective word line plate and a respective pillar, wherein the recess is of an arch-shape, and the chalcogenide material in the recess contacts the respective word line plate at middle of the recess and contacts the respective pillar at base of the recess.

In some examples, a contact area between the chalcogenide material and the respective word line plate is smaller than that a contact area between the chalcogenide material and the respective pillar.

In some examples, the contact area between the chalcogenide material and the respective word line plate is controlled by an alignment of the respective pillar with respect to the respective word line plate.

In some examples, the chalcogenide material in the recess contacts the dielectric material at opposite sides of the recess between the middle and the base.

In some examples, the vertical 3D memory device may include a conformal material positioned between the dielectric material and the first plurality of word line plates and the second plurality of word line plates, respectively, wherein the chalcogenide material in the recess contacts the conformal material at opposite sides of the recess between the middle and the base.

In some examples, a pillar of the plurality of pillars further comprises a barrier layer contacting at least portions of the chalcogenide material and a conductive material contacting the barrier layer and configured as a digit line.

In some examples, the plurality of pillars formed over the plurality of contacts interrupts a continuity of the dielectric material extending over the substrate in the serpentine shape.

In some examples, the plurality of contacts is arranged in a staggered pattern.

In some examples, the plurality of contacts is arranged in a grid.

In some examples, the vertical 3D memory device may include circuitry configured to select a respective word line and a respective digit line during a program operation or sense operation performed on the vertical 3D memory device.

A method of manufacturing a vertical 3D memory array is described. In some examples, the method may include forming a plurality of conductive contacts extending through a substrate, each associated with a respective one of a plurality of digit lines, forming a plurality of conductive layers separated from one another with a respective one of a plurality of dielectric layers, the plurality of conductive layers configured as word lines, forming a trench through the plurality of conductive layers and the plurality of dielectric layers, the trench exposing the substrate and dividing the plurality of conductive layers into a first set of word lines and a second set of word lines, depositing a dielectric material in the trench, forming a plurality of openings each over and exposing a respective contact by etching a portion of the dielectric material, forming, in the plurality of openings, a plurality of recesses in a plurality of planes where the plurality of conductive layers are located, forming a chalcogenide material in the plurality of recesses, and forming a plurality of conductive pillars each in a respective one of the plurality of openings and in contact with the chalcogenide material formed in a respective one of the plurality of recesses, the plurality of conductive pillars configured as digit lines, wherein each of the plurality of recesses is of an arch-shape and between a respective word line and a respective digit line, and the chalcogenide material in the recess contacts the respective word line at middle of the recess and contacts the respective digit line at base of the recess.

In some examples, a contact area between the chalcogenide material and the respective word line is smaller than a contact area between the chalcogenide material and the respective digit line.

In some examples, the contact area between the chalcogenide material and the respective word line is controlled by an alignment of the respective digit line with respect to the respective word line.

In some examples, the chalcogenide material in the recess contacts the dielectric material at opposite sides of the recess between the middle and the base.

In some examples, the method may include forming a conformal material between the dielectric material and the first set of word lines and the second set of word lines, respectively, wherein the chalcogenide material in the recess contacts the conformal material at opposite sides of the recess between the middle and the base.

In some examples, forming the plurality of openings may include performing a vertical etching process to vertically etch the dielectric material, wherein the vertical etching process is a dry etching process.

In some examples, forming the plurality of recesses may include performing a horizontal etching process after the vertical etching process to form at least one recess in at least one plane of the plurality of planes where at least one conductive layer of the plurality of conductive layers is located, wherein the horizontal etching process is an isotropic wet etching process.

In some examples, a conductive pillar of the plurality of conductive pillars further comprises a barrier layer contacting at least portions of the chalcogenide material and a conductive material contacting the barrier layer.

In some examples, the plurality of conductive pillars formed over the plurality of contacts interrupts a continuity of the dielectric material extending over the substrate in a serpentine shape.

In some examples, forming the trench may include performing a vertical etching process to vertically etch the trench and performing a horizontal etching process after the vertical etching process to form at least one groove in at least one conductive layer of the plurality of conductive layers.

In some examples, the trench comprising a first sidewall spaced apart from a second sidewall, wherein a first portion of the first sidewall formed by the plurality of dielectric layers is spaced apart from a first portion of the second sidewall formed by the plurality of dielectric layers by a first distance, and a second portion of the first sidewall formed by the plurality of conductive layers is spaced apart from a second portion of the second sidewall formed by the plurality of conductive layers by a second distance greater than the first distance.

A method of manufacturing a vertical 3D memory array is described. In some examples, the method may include forming a trench through a plurality of conductive layers and a plurality of dielectric layers of the 3D memory array, the trench exposing a substrate and dividing the plurality of conductive layers into a first set of word lines and a second set of word lines, depositing a dielectric material in the trench, forming a plurality of openings each exposing the substrate by etching a portion of the dielectric material, forming, in the plurality of openings, a plurality of recesses in a plurality of planes where the plurality of conductive layers are located, and forming a chalcogenide material in the plurality of recesses, wherein each of the plurality of recesses is of an arch-shape, and the chalcogenide material in the recess contacts a respective word line at an arch crown of the recess.

In some examples, the method may include forming a plurality of conductive pillars each in a respective one of the plurality of openings and in contact with the chalcogenide material formed in a respective one of the plurality of recesses, the plurality of conductive pillars configured as digit lines, wherein each of the plurality of recesses is between a respective word line and a respective digit line, and the chalcogenide material in the recess further contacts the respective digit line at base of the recess.

In some examples, a contact area between the chalcogenide material and the respective word line is smaller than that between the chalcogenide material and the respective digit line.

In some examples, the contact area between the chalcogenide material and the respective word line is controlled by an alignment of the respective digit line with respect to the respective word line.

In some examples, the chalcogenide material in the recess contacts the dielectric material at opposite sides of the recess between the arch crown and the base.

In some examples, the method may include forming a conformal material between the dielectric material and the first set of word lines and the second set of word lines, respectively, wherein the chalcogenide material in the recess contacts the conformal material at opposite sides of the recess adjacent to the arch crown.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above may be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A vertical 3D memory device, comprising:
a plurality of contacts associated with a plurality of digit lines and extending through a substrate;
a plurality of word line plates separated from one another by respective dielectric layers and including a first plurality of word line plates and a second plurality of word line plates;
a dielectric material positioned between the first plurality of word line plates and the second plurality of word line plates, the dielectric material extending in a serpentine shape over the substrate;
a plurality of pillars formed over and coupled with the plurality of contacts; and
a plurality of storage elements each comprising chalcogenide material positioned in a recess between a respective word line plate and a respective pillar,
wherein the recess is of an arch-shape, and the chalcogenide material in the recess contacts the respective word line plate at middle of the recess and contacts the respective pillar at base of the recess and contacts insulative material at a first sidewall of the recess and at a second sidewall of the recess in a direction perpendicular to a plane of the plurality of pillars and the plurality of word line plates.

2. The vertical 3D memory device of claim 1, wherein:
a contact area between the chalcogenide material and the respective word line plate is smaller than that a contact area between the chalcogenide material and the respective pillar.

3. The vertical 3D memory device of claim 2, wherein:
the contact area between the chalcogenide material and the respective word line plate is controlled by an alignment of the respective pillar with respect to the respective word line plate.

4. The vertical 3D memory device of claim 1, wherein:
the chalcogenide material in the recess contacts the dielectric material at opposite sides of the recess between the middle and the base.

5. The vertical 3D memory device of claim 1, further comprising:
a conformal material positioned between the dielectric material and the first plurality of word line plates and the second plurality of word line plates, respectively,
wherein the chalcogenide material in the recess contacts the conformal material at opposite sides of the recess between the middle and the base.

6. The vertical 3D memory device of claim 1, wherein:
a pillar of the plurality of pillars further comprises a barrier layer contacting at least portions of the chalcogenide material and a conductive material contacting the barrier layer and configured as a digit line.

7. The vertical 3D memory device of claim 1, wherein:
the plurality of pillars formed over the plurality of contacts interrupts a continuity of the dielectric material extending over the substrate in the serpentine shape.

8. The vertical 3D memory device of claim 1, wherein:
the plurality of contacts is arranged in a staggered pattern.

9. The vertical 3D memory device of claim 1, wherein:
the plurality of contacts is arranged in a grid.

10. The vertical 3D memory device of claim 1, further comprising:
   circuitry configured to select a respective word line and a respective digit line during a program operation or sense operation performed on the vertical 3D memory device.

* * * * *